United States Patent
Lee et al.

(10) Patent No.: US 11,552,154 B2
(45) Date of Patent: Jan. 10, 2023

(54) DISPLAY DEVICE WITH REDUCED AREA OF DEAD SPACE AT PERIPHERY OF A LIGHT TRANSMISSIVE AREA DISPOSED IN A DISPLAY AREA

(71) Applicant: Samsung Display Co., LTD., Yongin-si (KR)

(72) Inventors: Sang Hoon Lee, Hwaseong-si (KR); Ki Nyeng Kang, Sejong-si (KR); Sun Kwang Kim, Seoul (KR); Tae Woo Kim, Seoul (KR); Jong Hyun Choi, Seoul (KR); Tae Hoon Yang, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 85 days.

(21) Appl. No.: 16/915,532

(22) Filed: Jun. 29, 2020

(65) Prior Publication Data
US 2021/0126076 A1    Apr. 29, 2021

(30) Foreign Application Priority Data
Oct. 29, 2019    (KR) ..................... 10-2019-0135418

(51) Int. Cl.
*H01L 29/08*    (2006.01)
*H01L 27/32*    (2006.01)

(52) U.S. Cl.
CPC ...... *H01L 27/3276* (2013.01); *H01L 27/3262* (2013.01)

(58) Field of Classification Search
CPC .................. H01L 27/3276; H01L 27/3262
(Continued)

(56) References Cited

U.S. PATENT DOCUMENTS 10,134,826 B2    11/2018    Ka et al.
2016/0043156 A1*    2/2016    Ha ..................... H01L 27/322
257/40
(Continued)

FOREIGN PATENT DOCUMENTS

CN    107894862    4/2018
CN    107977114    5/2018
(Continued)

OTHER PUBLICATIONS

Extended European Search Report—European Patent Application No. 20194748.8 dated Feb. 12, 2021, citing references listed within.
(Continued)

*Primary Examiner* — Phuc T Dang
(74) *Attorney, Agent, or Firm* — Cantor Colburn LLP

(57) ABSTRACT

A display device includes a substrate including a display area including pixels, and a light transmissive area including a portion in the display area, and signal lines disposed in the display area and electrically connected with the pixels, where the signal lines include a first signal line on a first side, a second signal line on a second side and arranged with the first signal line in a first direction, and a third signal line on a third side, and the third signal line is arranged with the first signal line and the second signal line in a second direction, the first and second signal lines are insulated from each other in the display area, and a length of the first signal line is longer than a length of the second signal line in the first direction.

20 Claims, 20 Drawing Sheets

(58) Field of Classification Search
USPC .......................................................... 257/40
See application file for complete search history.

(56) References Cited

U.S. PATENT DOCUMENTS

| | | | |
|---|---|---|---|
| 2017/0053971 A1* | 2/2017 | Sato | ................... H01L 51/5209 |
| 2017/0207289 A1* | 7/2017 | Kang | ................... H01L 27/3265 |
| 2018/0108685 A1* | 4/2018 | Kim | ................... H01L 27/1262 |
| 2019/0056819 A1 | 2/2019 | Moon et al. | |
| 2019/0156760 A1 | 5/2019 | Noh et al. | |
| 2019/0245020 A1 | 8/2019 | Choi et al. | |

FOREIGN PATENT DOCUMENTS

| | | |
|---|---|---|
| KR | 1020170102147 | 9/2017 |
| KR | 1020170114026 | 10/2017 |
| KR | 1020170117291 | 10/2017 |
| KR | 1020180042351 | 4/2018 |

OTHER PUBLICATIONS

European Office Action—European Patent Application No. 20194748.8 dated Nov. 25, 2022.

\* cited by examiner

DISPLAY DEVICE WITH REDUCED AREA OF DEAD SPACE AT PERIPHERY OF A LIGHT TRANSMISSIVE AREA DISPOSED IN A DISPLAY AREA

This application claims priority to Korean Patent Application No. 10-2019-0135418, filed on Oct. 29, 2019, and all the benefits accruing therefrom under 35 U.S.C. § 119, the content of which in its entirety is herein incorporated by reference.

BACKGROUND

(a) Field

Exemplary embodiments of the invention relate to a display device.

(b) Description of the Related Art

A display device such as a liquid crystal display ("LCD"), an organic light emitting diode ("OLED") display, and the like includes a display panel that includes a plurality of pixels that display an image. Each pixel includes a pixel electrode that receives a data signal, and the pixel electrode is connected to at least one transistor and thus receives the data signal.

Recently, various display devices having various functions other than image displaying have been developed. For example, a display device embedded with a camera function has been developed.

SUMMARY

Exemplary embodiments of the invention relate to a display device where a light transmissive area is disposed in a display area to minimize occurrence of luminance deviation in a displayed image while reducing the area of a dead space at the periphery of the light transmissive area.

An exemplary embodiment of a display device according to the invention includes a substrate that includes a display area including a plurality of pixels, and a light transmissive area including a portion disposed in the display area, and a plurality of signal lines that are disposed in the display area and electrically connected with the plurality of pixels, where the plurality of signal lines includes a first signal line that is disposed on a first side with reference to the light transmissive area, a second signal line that is disposed on a second side with reference to the light transmissive area and arranged with the first signal line in a first direction, and a third signal line that is disposed on a third side with reference to the light transmissive area, and the third signal line is arranged with the first signal line and the second signal line in a second direction that is different from the first direction the first signal line and the second signal line are insulated from each other in the display area, and a length of the first signal line in the first direction is longer than a length of the second signal line in the first direction.

An exemplary embodiment of a display device according to the invention includes a substrate that includes a display area including a plurality of pixels, and a light transmissive area including a portion disposed in the display area, and a plurality of signal lines that are disposed in the display area and electrically connected with the plurality of pixels, where the plurality of signal lines includes a first signal line that is disposed on a first side with reference to the light transmissive area, a second signal line that is disposed on a second side with reference to the light transmissive area and arranged with the first signal line in a first direction, and a third signal line that is disposed on a third side with reference to the light transmissive area, the third signal line is arranged with the first signal line and the second signal line in a second direction that is different from the first direction, the display area includes a disconnection corresponding area that overlaps the light transmissive area in the second direction, and the third signal line is connected to at least one resistor disposed in the disconnection corresponding area.

An exemplary embodiment of a display device according to the invention includes a substrate that includes a display area including a plurality of pixels, and a light transmissive area including a portion disposed in the display area, and a plurality of signal lines that are disposed in the display area and electrically connected with the plurality of pixels, where the plurality of signal lines includes a first signal line that is disposed on a first side with reference to the light transmissive area, a second signal line that is disposed on a second side with reference to the light transmissive area and arranged with the first signal line in a first direction, and a third signal line that is disposed on a third side with reference to the light transmissive area, where the display device includes a resistor connected to an end portion of the second signal line, adjacent to the light transmissive area.

In the exemplary embodiments of the invention, a display device where a light transmissive area is disposed in a display area may be provided to minimize occurrence of luminance deviation in a displayed image while reducing the area of a dead space at the periphery of the light transmissive area.

BRIEF DESCRIPTION OF THE DRAWINGS

The above and other exemplary embodiments, advantages and features of this disclosure will become more apparent by describing in further detail exemplary embodiments thereof with reference to the accompanying drawings, in which.

DETAILED DESCRIPTION

Figure 1:
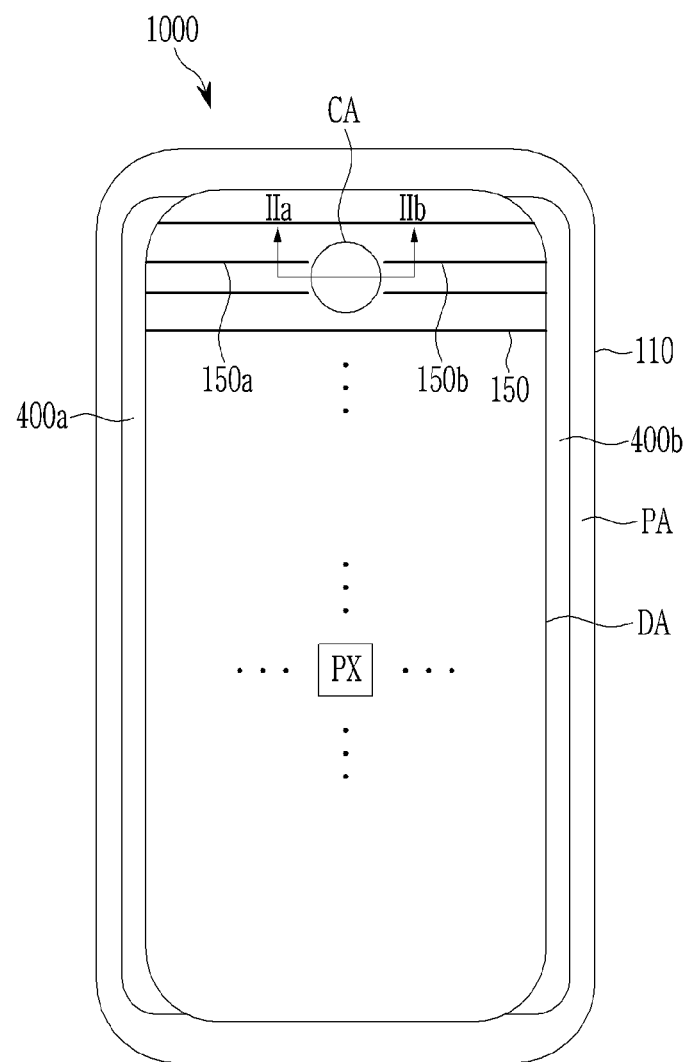
FIG. 1 is a plan view of an exemplary embodiment of a display device according to the invention.

In the following detailed description, only certain exemplary embodiments of the invention have been shown and described, simply by way of illustration. As those skilled in the art would realize, the described embodiments may be modified in various different ways, all without departing from the spirit or scope of the invention.

Accordingly, the drawings and description are to be regarded as illustrative in nature and not restrictive. Like reference numerals designate like elements throughout the specification Since the size and thickness of each configuration shown in the drawings are arbitrarily expressed for better understanding and ease of description, the invention is not necessarily limited to as illustrated. In the drawings, the thickness of layers, films, panels, regions, etc., are exaggerated for clarity. In addition, in the drawings, the thickness of some layers and regions is exaggerated for better understanding and ease of description.

It will be understood that when an element such as a layer, film, region, or substrate is referred to as being "on" another element, it can be directly on the other element or intervening elements may also be present. In contrast, when an element is referred to as being "directly on" another element, there are no intervening elements present. The word "on" or "above" means positioned on or below the object portion, and does not necessarily mean positioned on the upper side of the object portion based on a gravitational direction.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items.

In addition, unless explicitly described to the contrary, the word "comprise" and variations such as "comprises" or "comprising" will be understood to imply the inclusion of stated elements but not the exclusion of any other elements.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. In an exemplary embodiment, when the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, when the device in one of the figures is turned over, elements described as "below" or "beneath" other elements would then be oriented "above" the other elements. The exemplary terms "below" or "beneath" can, therefore, encompass both an orientation of above and below.

Throughout the specification, "in a plan view (also referred to as "on a plane")" implies a view for observation of a plane that is parallel with two crossing directions (e.g., a first direction DR1 and a second direction DR2), and "in a cross-sectional view" implies a view for observation of a plane cut along a direction (e.g., a third direction DR3) that is perpendicular to the plane that is parallel with the first direction DR1 and the second direction DR2. In addition, when two constituent elements overlap, unless otherwise stated, it means that the two constituent elements overlap in the third direction DR3 (e.g., in a direction perpendicular to the top side of the substrate).

First, referring to FIGS. 1 to 3, an exemplary embodiment of a display device according to the invention will be described.

Figure 2:
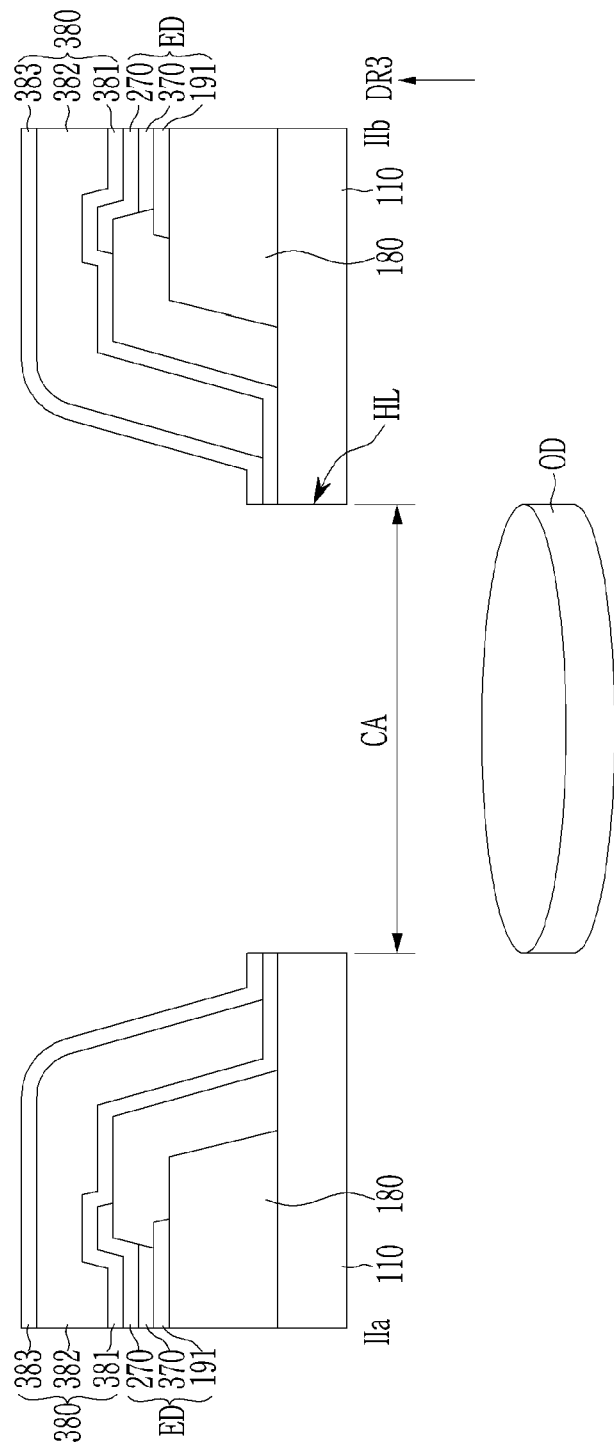
FIG. 2 is a cross-sectional view of the display device of FIG. 1, taken along line IIa-IIb.

FIG. 1 is a plan view of an exemplary embodiment of a display device according to the invention, and FIG. 2 is a cross-sectional view of the display device of FIG. 1, taken along line IIa-IIb.

The display device in the exemplary embodiment of the invention includes a display panel 1000 including a display area DA, a light transmissive area CA, and a peripheral area PA.

The display area DA is an area where a plurality of pixels PX is arranged and thus an image may be displayed. Each pixel PX may include a pixel circuit including at least one transistor and a light emitting portion where light of an image is displayed. A plurality of signal lines 150, 150*a*, and 150*b* is disposed in the display area DA.

The light transmissive area CA is an area where an image is not displayed, and at least a part of the light transmissive area CA may be surrounded by the display area DA in a plan view. In a plan view, as shown in FIG. 1, the light transmissive area CA may be fully surrounded by the display area DA, or may be concave from the edge of the display area DA and thus attached to the edge of the display area DA. Such a light transmissive area CA may be referred to as including a portion disposed inside the display area DA.

The light transmissive area CA has higher light transmittance than that of the display area DA and the peripheral area PA.

Referring to FIG. 2, the display device in the exemplary embodiment of the invention may further include at least one optical device OD disposed below the display panel 1000. The light transmissive area CA is an area where light may enter into the optical device OD disposed therebelow along the third direction DR3 of the display panel 1000 or light may be emitted from the optical device OD.

In an exemplary embodiment, the optical device OD may be provided as a camera, a flash, a sensor, and the like, for example. In an exemplary embodiment, the optical device OD may emit light of a predetermined wavelength range toward an object disposed on the display panel 1000 or may receive light reflected from the object, for example. The light having a predetermined wavelength may be light having a wavelength other than the visible light region, which is light of an image displayed in the display area DA as light having a wavelength that may be processed by the optical device OD, or light in the visible region such as the light of an image displayed in the display area DA.

Such an optical device OD may overlap the light transmissive area CA in the third direction DR3, and light emitted from or entered into the optical device OD may pass through the light transmissive area CA of the display panel 1000. In a plan view, the optical device may have the area that wholly or partially corresponds to the light transmissive area CA.

As shown in FIG. 1, the light transmissive area CA may be disposed substantially at a center of the display area DA in the first direction DR1 while being disposed close to the upper end of the display area DA, but the position of the light transmissive area CA is not limited thereto.

The signal lines 150, 150*a*, and 150*b* may be connected with transistors of the respective pixel circuits. The plurality of signal lines 150, 150*a*, and 150*b* may respectively extend substantially in the first direction DR1.

The signal lines 150, 150*a*, and 150*b* respectively extended in the first direction DR1 may not overlap the light transmissive area CA in a plan view.

In a plan view, the signal line 150*a* may be disposed at one side (e.g., the left side) with reference to the light transmissive area CA, the signal line 150*b* may be disposed at the other side (e.g., the right side) with reference to the light transmissive area CA, and the signal line 150 may be disposed at another side (e.g., a lower side or an upper side) with reference to the light transmissive area CA.

A length of the signal line 150 in the first direction DR1 is longer than a length of each of the signal lines 150*a* and 150*b* in the first direction DR1.

The plurality of signal lines 150*a* and the plurality of signal lines 150*b* may be disposed in a one-to-one correspondence with a pair of signal lines 150*a* and 150*b* aligned in the first direction DR1. A pair of signal lines 150*a* and 150*b* arranged in the first direction DR1 may be insulated from each other rather than being electrically connected with each other in the display area DA.

Virtual extension lines of the signal lines 150*a* and 150*b* in the first direction DR1 may pass through the light transmissive area CA.

The signal lines 150*a* and 150*b* and the signal lines 150 may be arranged in the second direction DR2.

The signal line 150 extends to the right edge from the left edge of the display area DA, the signal line 150*a* extends only to the inside of the display area DA from the left edge of the display area DA, and the signal line 150*b* extends only to the inside of the display area DA from the right edge of the display area DA.

The peripheral area PA is an area where an image is not displayed, and is adjacent to the periphery of the display area DA. In an exemplary embodiment, the peripheral area PA may surround the display area DA, for example. However, in some cases, at least some of the peripheral area PA may display an image.

The peripheral area PA may include drivers 400*a* and 400*b* that are connected with the plurality of signal lines 150, 150*a*, and 150*b* and apply a driving signal. FIG. 1 exemplarily illustrates that a first driver 400*a* is disposed at an outer side of the left edge of the display area DA and a second driver 400*b* is disposed at an outer side of the right edge of the display area DA. In an exemplary embodiment, the drivers 400*a* and 400*b* may be gate drivers that generate a gate signal that includes a gate-on voltage and a gate-off voltage and apply the gate signal to the signal lines 150, 150*a*, and 150*b*, for example. The drivers 400*a* and 400*b* may sequentially apply the gate signal to the plurality of signal lines 150, 150*a*, and 150*b* along a direction that is parallel with the second direction DR2.

The signal line 150 is connected to the two drivers 400*a* and 400*b* without passing through the light transmissive area CA and thus may receive the driving signals from the two drivers 400*a* and 400*b*.

The signal lines 150*a* and 150*b* may be connected to only one of the two drivers 400*a* and 400*b* and thus may receive a driving signal therefrom.

A pair of signal lines 150*a* and 150*b* that are arranged in the first direction DR1 may be provided in a disconnected form since a single signal line that horizontally extends like the signal line 150 is removed in the light transmissive area CA and at the periphery thereof. Specifically, the signal line 150*a* is connected to the driver 400*a* on the left side and extends substantially in the first direction DR1 to a portion close to the light transmissive area CA, and the signal line 150*b* is connected to the driver 400*b* on the right side and extends substantially in the first direction to a portion close to the light transmissive area CA. That is, each of the signal lines 150*a* and 150*b* has an end portion that is disposed at the periphery of the light transmissive area CA in the display area DA. Each of the ends of the signal lines 150*a* and 150*b* in the display area DA may neighbor the light transmissive area CA in the display area DA.

The drivers 400*a* and 400*b* may be integrated on a substrate 110 of the display panel 1000 when the pixel circuit of the pixel PX is provided, through the same process.

Referring to FIG. 2, an opening HL may be defined in the substrate 110 included in the display panel 1000 by removing a portion that corresponds to (or overlaps) the light transmissive area CA. The optical device OD may be disposed corresponding to the opening HL of the substrate 110. In a plan view, the opening HL of the substrate 110 may be disposed inside the display area DA.

At least one insulation layer 180 and at least one conductive layer are disposed on the substrate 110, and a pixel electrode 191, a light emission layer 370, and a common electrode 270 may be disposed thereon. A pixel electrode 191, a light emission layer 370, and a common electrode 270 disposed in one pixel PX may form a light emitting diode ED.

An encapsulation layer 380 that includes at least one inorganic layer and at least one organic layer may be disposed on the light emitting diode ED. The encapsulation layer 380 may include, for example, a plurality of inorganic layers 381 and 383 and an organic layer 382 that is disposed between neighboring inorganic layers 381 and 383. The organic layer 382 has an end or an edge spaced apart from the opening HL of the substrate 110, and the inorganic layers 381 and 383 may further extend toward the opening HL from the organic layer 382 and thus may have an edge that is adjacent to the edge of the opening HL of the substrate 110. The inorganic layers 381 and 383 may define an opening HL together with the substrate 110 by removing portions that correspond to the light transmissive area CA. The encapsulation layer 380 encapsulates the periphery of the opening HL to prevent a foreign material such as moisture and the like from entering into the display panel 1000 through the opening HL from the outside.

Figure 3:
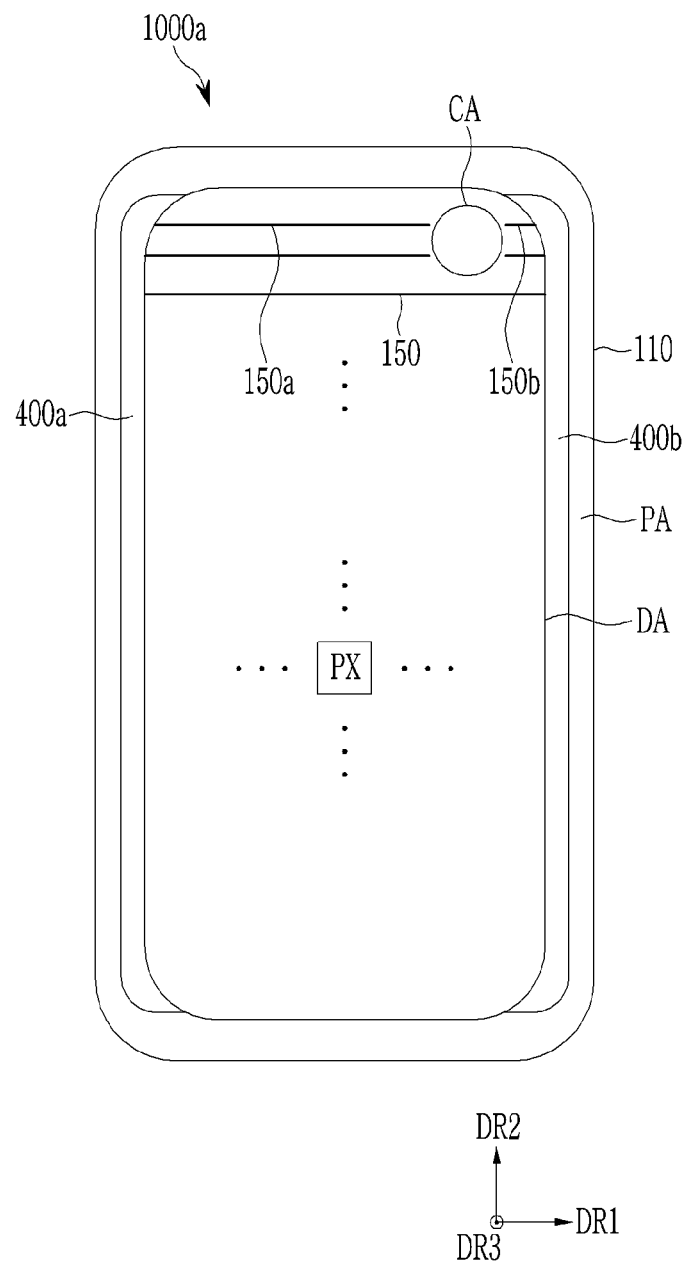
FIGS. 3, 4, and 5 are plan views of an exemplary embodiment of a display device according to the invention.

FIG. 3 is a plan view of an exemplary embodiment of a display device according to the invention.

Referring to FIG. 3, a display panel 1000*a* included in a display device in the illustrated exemplary embodiment is substantially the same as the display panel 1000 shown in FIG. 1, except that a light transmissive area CA is disposed close to an upper end of a display area DA while being disposed close to a left or right edge of the display area DA. That is, a distance from the left edge of the display area DA to the light transmissive area CA and a distance from the right edge of the display area DA to the light transmissive area CA may be different from each other.

A length of a signal line 150a disposed on the left side with reference to the light transmissive area CA may be different from a length of a signal line 150b disposed on the right side with reference to the light transmissive area CA. FIG. 3 illustrates an example in which the light transmissive area CA is adjacent to the right edge of the display area DA and the length of the signal line 150a is longer than the length of the signal line 150b.

In the exemplary embodiment of the invention, the light transmissive area CA where the optical device OD is disposed is disposed in the display area DA in the display device where the optical device OD such as a camera and the like is disposed behind the display panels 1000 and 1000a, and accordingly, the area of the peripheral area PA may be reduced compared to a display device where an optical device OD is disposed outside the display area DA.

In the exemplary embodiment of the invention, the signal lines 150a and 150b, which may be only possible to extend to each other through the light transmissive area CA, end at the periphery of the light transmissive area CA. Thus, since no signal line that extends while detouring around the light transmissive area CA is provided, there is no need to form an additional wiring area at the periphery of the light transmissive area CA. Accordingly, the area of a dead space where no image may be displayed at the periphery of the light transmissive area CA may be significantly reduced. In particular, in case of a high-resolution display device, a number of signal lines that need to pass the light transmissive area CA by detouring around the same may be increased, and in the exemplary embodiment of the invention, there is no need to form a detouring area of signal lines that are increased as the display device is high-resolution at the periphery of the light transmissive area CA such that the dead space around the light transmissive area CA may be further reduced.

Next, an exemplary embodiment of a display device according to the invention will be described with reference to FIGS. 4 and 5, together with the above-described drawings.

Figure 4:
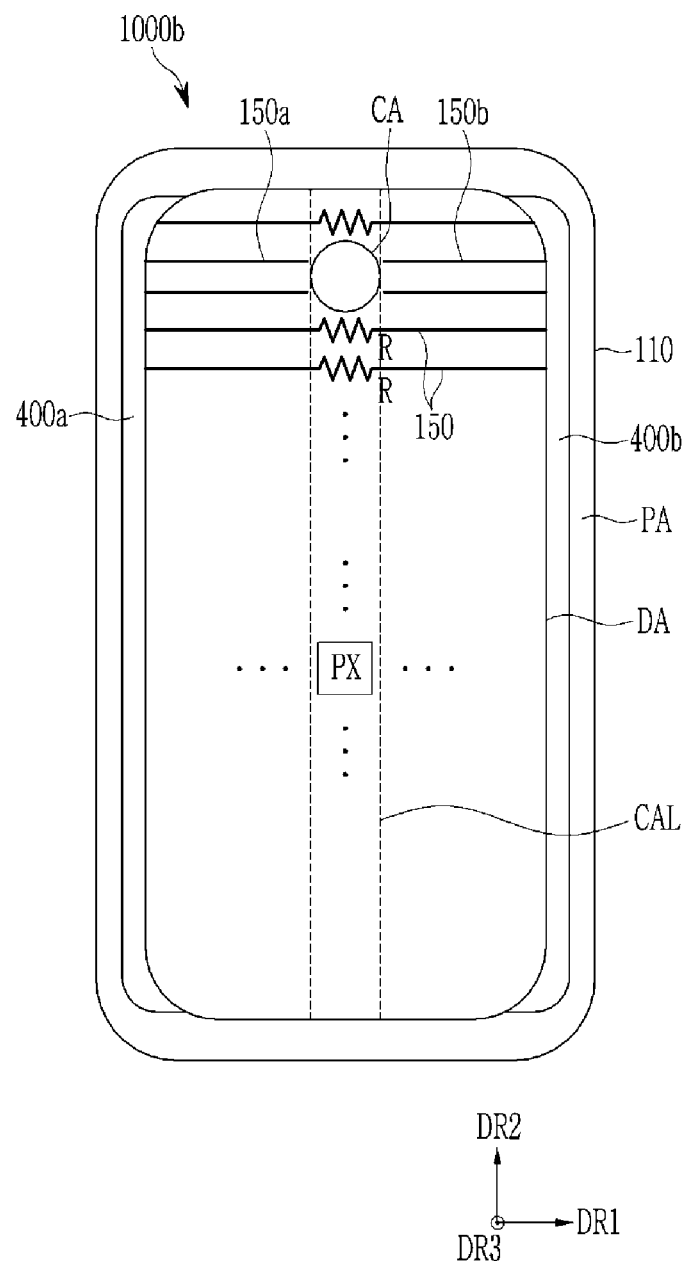
Figure 5:
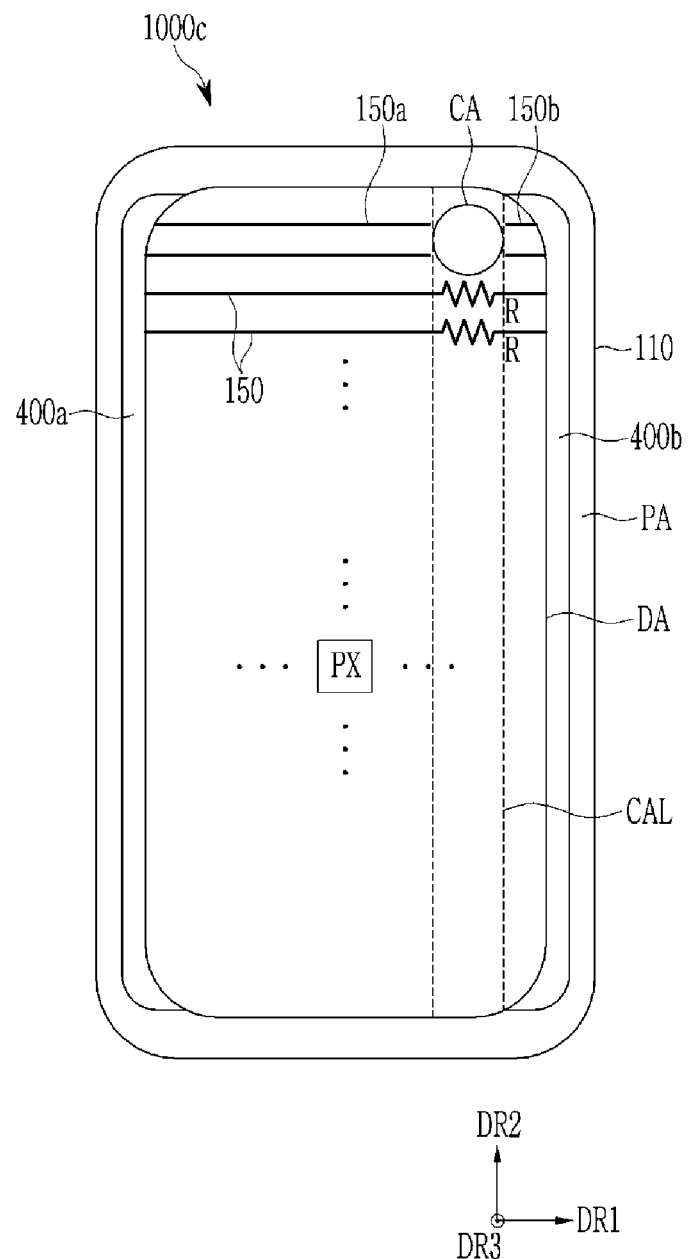

FIGS. 4 and 5 are plan views of an exemplary embodiment of a display device according to the invention.

First, referring to FIG. 4, a display panel 1000b included in a display device according to the illustrated exemplary embodiment is substantially the same as the display panel of the above-described exemplary embodiment, except that a signal line 150 is connected to at least one resistor T disposed in a display area DA. The resistor R may be a portion having conductivity lower than conductivity of other portions.

A virtual area provided by vertically extending the light transmissive area CA in parallel with a second direction DR2 in the display area DA is referred to as a disconnection corresponding area CAL. That is, the disconnection corresponding area CAL may be a part of the display area DA, overlapping the light transmissive area CA in the second direction DR2. The disconnection corresponding area CAL may extend from an upper end of the display area DA to a lower end thereof. A width of the disconnection corresponding area CAL in the first direction DR1 may be substantially equal to a width of the light transmissive area CA in the first direction DR1.

The resistor R connected with the signal line 150 may correspond to the disconnection corresponding area CAL. Accordingly, one signal line 150 may be divided into a signal line portion that is disposed on the left side with reference to the resistor R and connected to a driver 400a, and a signal line portion that is disposed on the right side with reference to the resistor R and connected to a driver 400b. The signal line portion on the left side of the signal line 150 may be arranged with the signal line 150a in the second direction DR2 and thus overlap each other, and the signal line portion on the right side of the signal line 150 is arranged with the signal line 150b in the second direction DR2 and thus overlap each other.

All of the signal lines 150 may be connected with the resistors R.

Referring to FIG. 5, a display panel 1000c included in a display device according to the illustrated exemplary embodiment is substantially the same as the display panel 1000b of the exemplary embodiment illustrated in FIG. 4, and like the display panel 1000a of the above-described exemplary embodiment, a light transmissive area CA may be disposed close to a left or right edge while being close to an upper end of a display area DA.

Accordingly, a disconnection corresponding area CAL may be disposed close to the left side or the right side in the display area DA. A width in a first direction DR1 of a portion of the display area DA on the right side with reference to the disconnection corresponding area CAL may be different from a width in the first direction DR1 of a portion of the display area DA on the left side with reference to the disconnection corresponding area CAL. FIG. 5 illustrates an example in which the disconnection corresponding area CAL is disposed close to the right edge of the display area DA.

According to the illustrated exemplary embodiment, signal lines 150a and 150b that neighbor the light transmissive area CA in the first direction DR1 include end portions that are disposed at the periphery of the light transmissive area CA, and are connected with one of drivers 400a and 400b and receive a driving signal.

Thus, an RC delay of a driving signal transmitted from the signal line 150 that is connected with the two drivers 400a and 400b and receives the driving signal and an RC delay of a driving signal transmitted from the signal lines 150a and 150b may be different from each other. In particular, a driving signal applied to a pixel PX disposed at the periphery of the light transmissive area CA where the end portions of the signal lines 150a and 150b are disposed may have an RC delay longer than an RC delay of a driving signal applied to a pixel PX that is disposed in a disconnection corresponding area CAL and connected to the signal line 150. Accordingly, luminance deviation may occur between a display area DA on the left side and a display area DA on the right side with reference to the light transmissive area CA, or luminance deviation may occur between a plurality of pixels PX disposed with the light transmissive area CA in the first direction DR1 and pixels PX in the remaining display areas DA.

However, in the exemplary embodiment of the invention, signal lines 150 disposed in a disconnection corresponding area CAL that corresponds to the light transmissive area CA are connected to resistors R, and thus a driving signal of the signal line 150 may have an RC delay similar to an RC delay of driving signals of the signal lines 150a and 150b, and occurrence of luminance deviation between the above-described positions of the display areas DA may be minimized.

Next, an exemplary embodiment of a display device according to the invention will be described with reference to FIGS. 6 to 10, together with the above-described drawings.

FIGS. 6, 7, 8, 9, and 10 are enlarged plan views of an exemplary embodiment of the periphery of a light transmissive area of a display device according to the invention.

Figure 6:
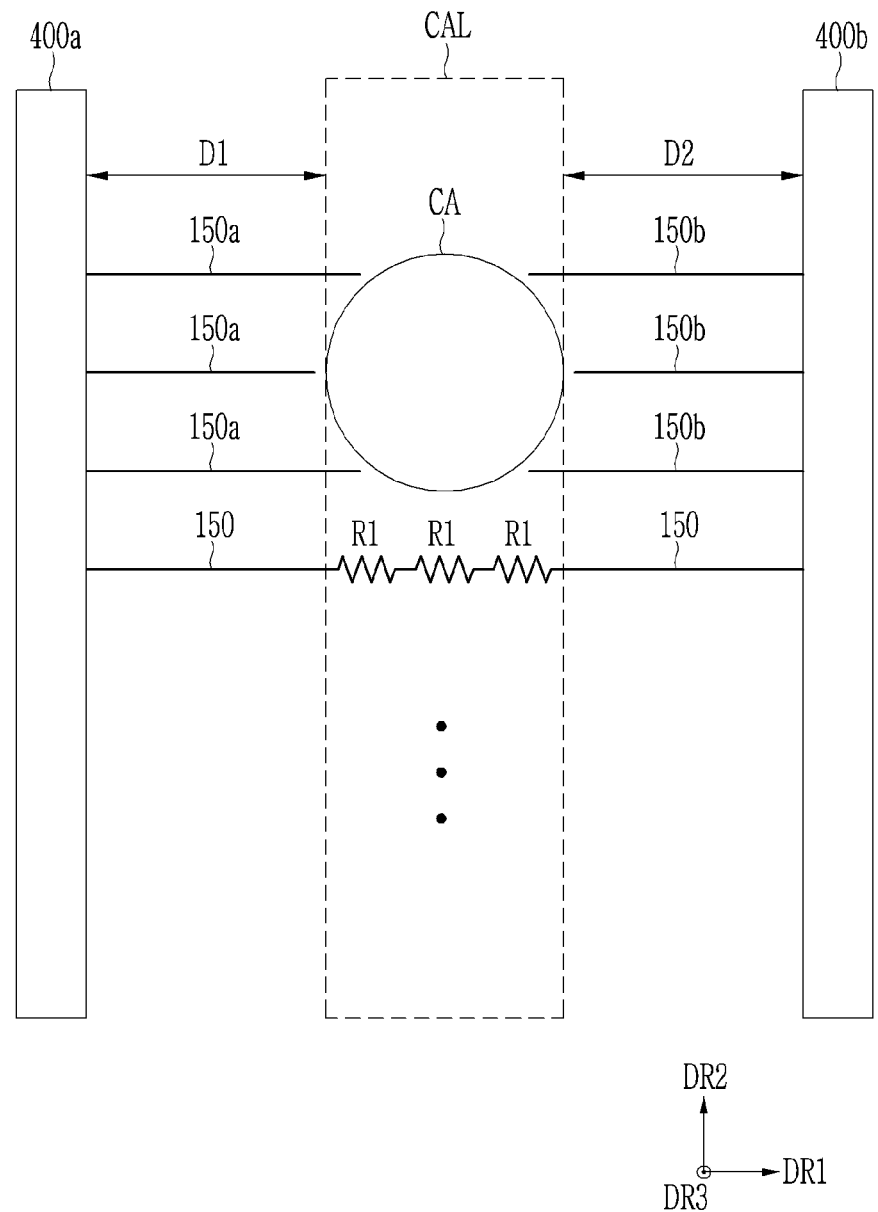
FIGS. 6, 7, 8, 9 and 10 are enlarged plan views of an exemplary embodiment of the periphery of a light transmissive area of a display device according to the invention.

First, referring to FIG. 6, a display panel of a display device according to the illustrated exemplary embodiment is substantially the same as the display panel 1000b included in the display device of the exemplary embodiment shown in FIG. 4, except that signal lines 150 are connected to a plurality of resistors R1 disposed in a disconnection corresponding area CAL. The plurality of resistors R1 may have the same resistance value.

In the illustrated exemplary embodiment, a distance D1 between a driver 400a on the left side and the disconnection corresponding area CAL may be substantially the same as or similar to a distance D2 between a driver 400b on the right side and the disconnection corresponding area CAL.

Figure 7:
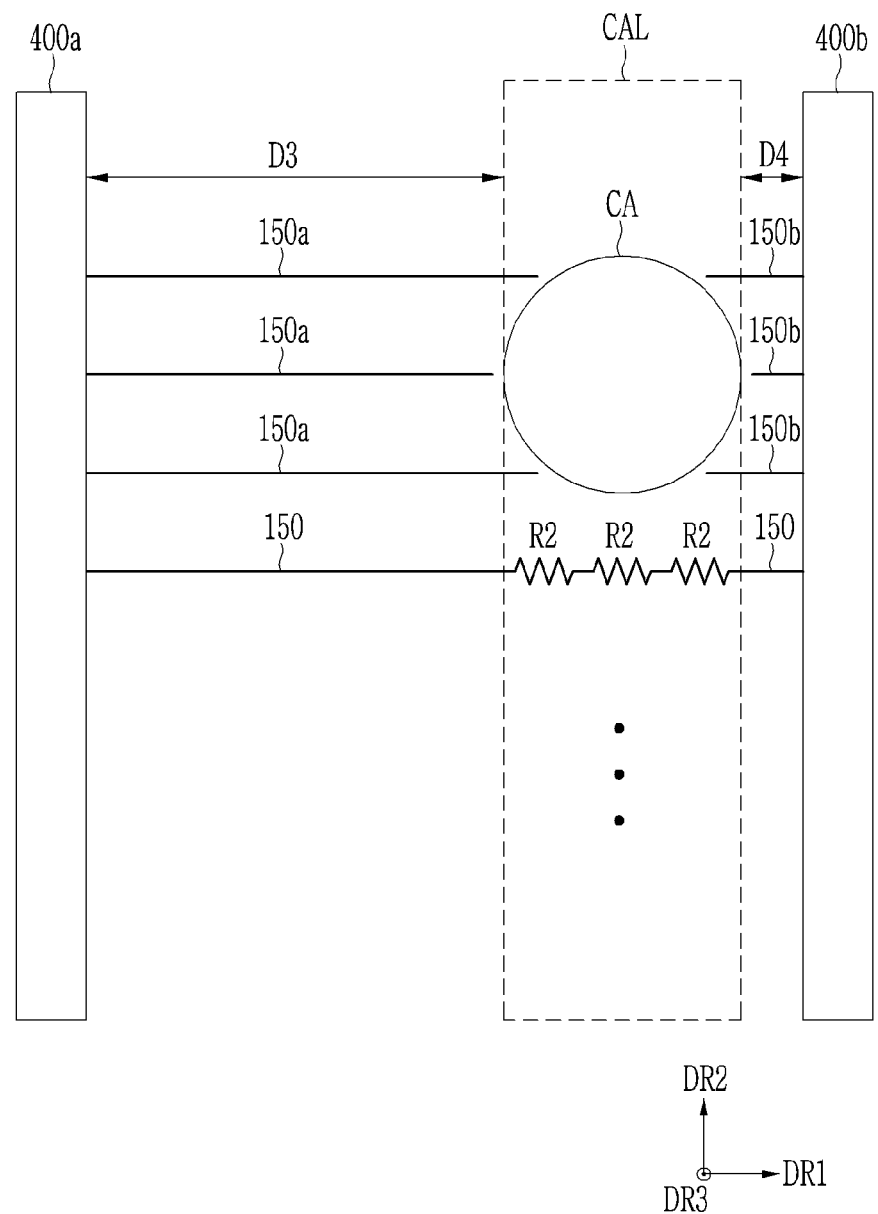

Next, referring to FIG. 7, a display panel of a display device according to the illustrated exemplary embodiment is substantially the same as the display panel 1000c included in the display device of the exemplary embodiment shown in FIG. 5, except that signal lines 150 are connected to a plurality of resistors R2 disposed in a disconnection corresponding area CAL. The plurality of resistors R2 may have the same resistance value.

In the illustrated exemplary embodiment, a distance D3 between a driver 400a on the left side and the disconnection corresponding area CAL may be different from a distance D4 between a driver 400b on the right side and the disconnection corresponding area CAL. In FIG. 7, the distance D3 is longer than the distance D4.

Figure 8:
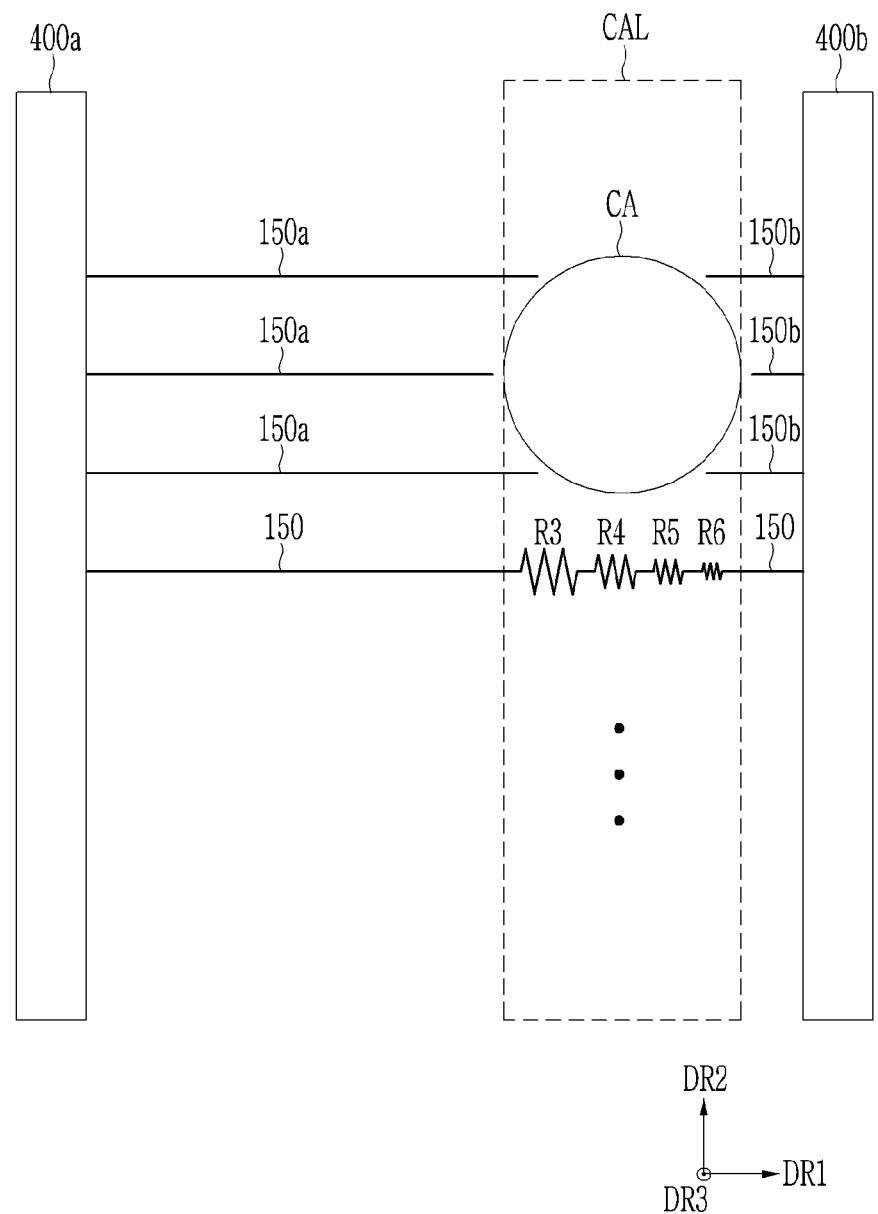

Next, referring to FIG. 8, a display device according to the illustrated exemplary embodiment is substantially the same as the display device of the exemplary embodiment shown in FIG. 7, except that a signal line 150 is connected to a plurality of resistors R3, R4, R5, and R6 that are disposed in a disconnection corresponding area CAL.

At least two resistors of the plurality of resistors R3, R4, R5, and R6 may have different resistance values.

An end portion of a signal line 150b disposed on the right side with reference to a light transmissive area CA is disposed relatively close to a driver 400b that receives a driving signal, and thus an RC delay of the end portion of the signal line 150b may be significantly shorter compared to an RC delay of an end portion of a signal line 150a. Thus, a resistance value of the resistor R6 that is disposed closest to the driver 400b or the right edge of the display area DA among the plurality of resistors R3, R4, R5, and R6 disposed in the disconnection corresponding area CAL may be set to be the least, and a resistance value of the resistor R3 that is disposed closest to the driver 400a or the left edge of the display area DA may be set to be the greatest.

It is exemplarily illustrated in FIG. 8 that resistance values of the plurality of resistors R3, R4, R5, and R6 are gradually increased or decreased along the first direction DR1. As shown in FIG. 8, when the light transmissive area CA is disposed closer to the driver 400b on the right side, the plurality of resistors R3, R4, R5, and R6 may have resistance values that are gradually decreased toward the driver 400b on the right side.

According to the illustrated exemplary embodiment, the deterioration of the signal delay may be more precisely compensated, thereby further reducing the deterioration of the image.

Figure 9:
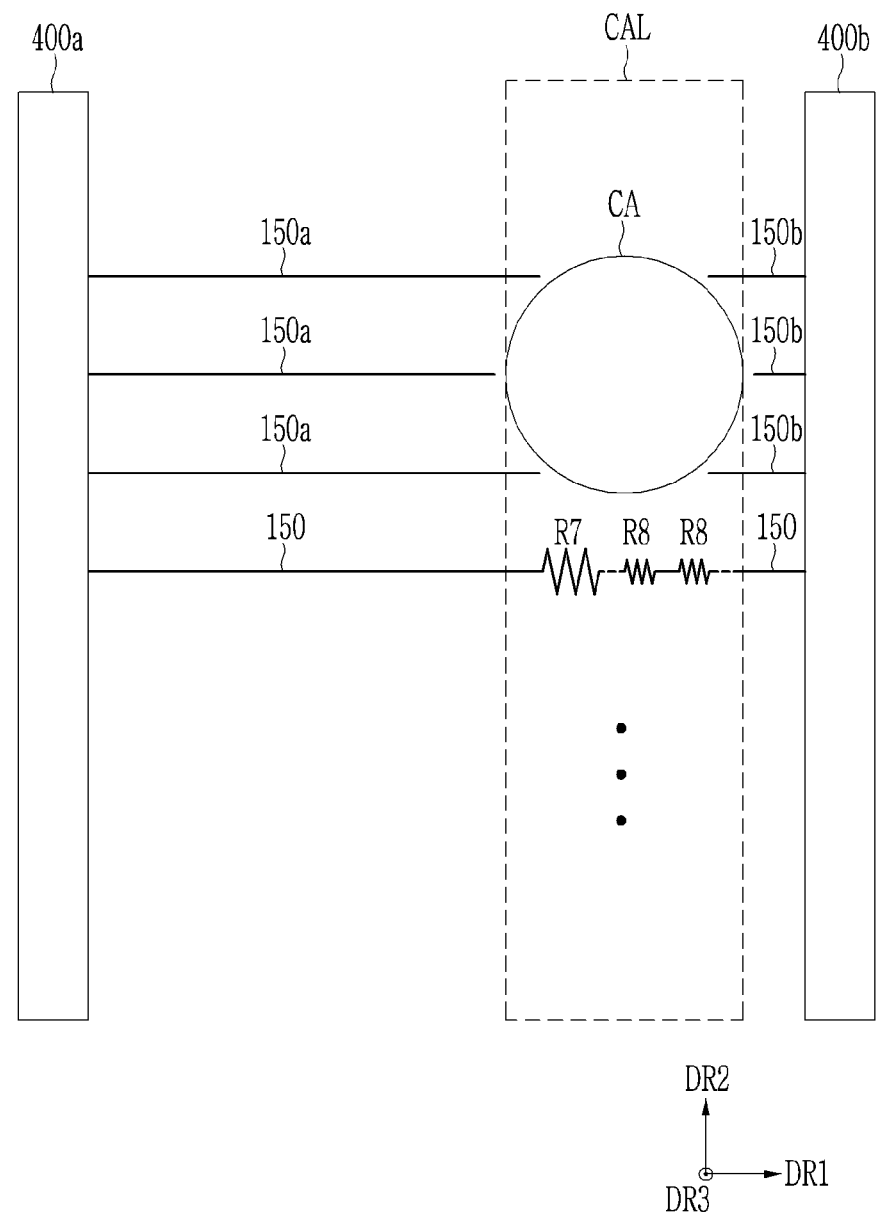

Next, referring to FIG. 9, a display device according to the illustrated exemplary embodiment is substantially the same as the display device of the exemplary embodiment shown in FIG. 7, except that a signal line 150 is connected to a plurality of resistors R7 and R8 that are disposed in a disconnection corresponding area CAL.

A resistance value of the resistor R7 disposed on the leftmost side among the plurality of resistors R7 and R8 has the maximum resistance value, and the other resistor R8 may have a resistance value lower than that of the resistor R7. The resistor R8 connected to a single signal line 150 may be provided in plural as shown in the drawing, or may be provided singularly. The plurality of resistors R8 connected to the single signal line 150 may be the same or similar resistance values.

As described, when the light transmissive area CA is disposed to one side of the display area DA, for example, close to the right edge of the display area DA, a signal line 150a disposed on the left side of the light transmissive area CA may experience the longest RC signal delay at the end portion that is adjacent to the light transmissive area CA. When a resistance value of the leftmost resistor R3 that is disposed closest to the left edge of the disconnection corresponding area CAL is set to be the maximum among the plurality of resistors R7 and R8, an area arranged with an area corresponding to the end portion of the signal line 150a in the second direction DR2 may experience RC signal delay that is similar to the RC signal delay of the end portion of the signal line 150a. Accordingly, a luminance deviation between luminance at the periphery of the light transmissive area CA and luminance at the periphery of the disconnection corresponding area CAL may be reduced.

Figure 10:
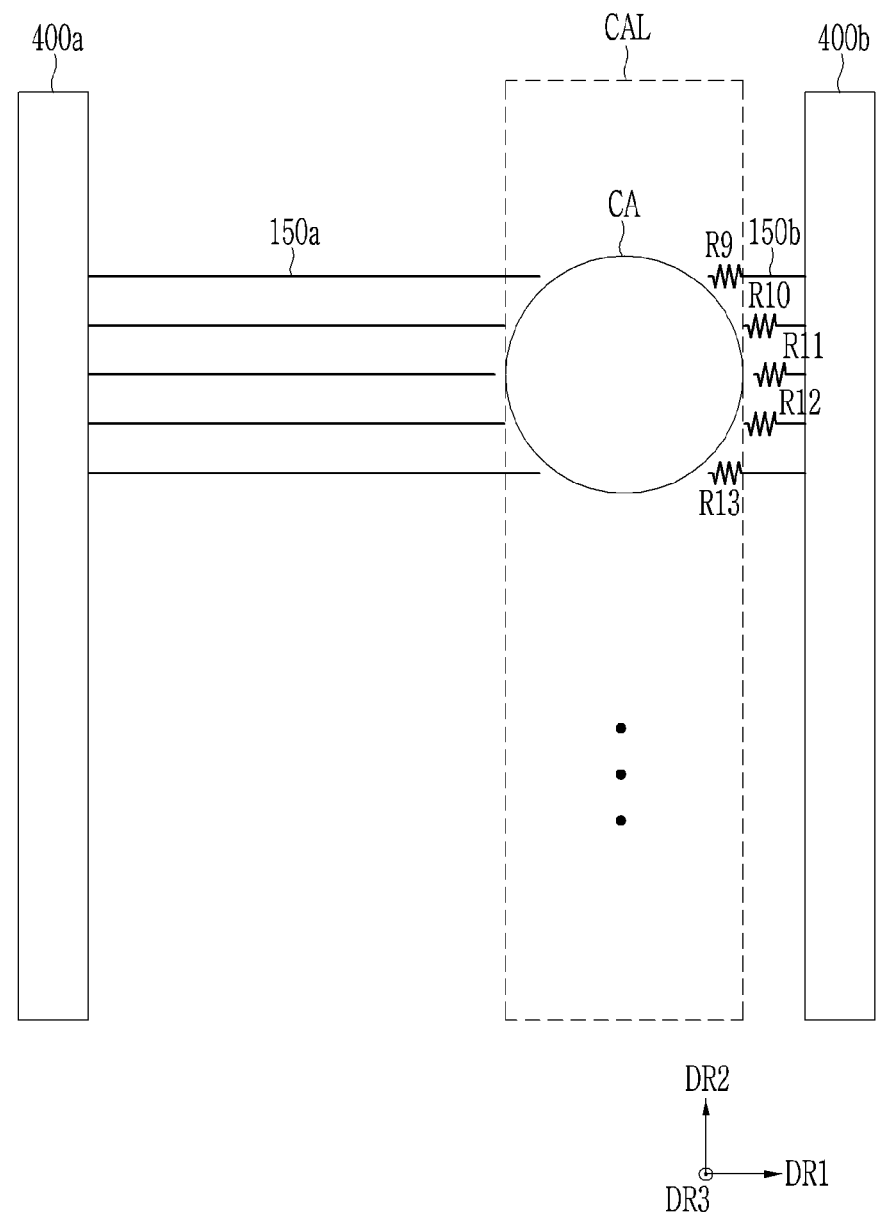

Next, referring to FIG. 10, a display device according to the illustrated exemplary embodiment is substantially the same as the display device of the exemplary embodiment shown in FIG. 5, FIG. 7, FIG. 8, or FIG. 9, except that resistors R9, R10, R11, R12, and R13 may be connected to an end portion of a signal line 150a or a signal line 150b that is adjacent to a light transmissive area CA. As shown in FIG. 10, when light transmissive area CA is disposed close to a right edge of a display area DA, the resistors R9, R10, R11, R12, and R13 may be connected to an end portion of the signal line 150b disposed on the right side of the light transmissive area CA. On the contrary, when the light transmissive area CA is disposed close to a left edge of the display area DA, the resistors may be connected to the end portion of the signal line 150a.

When the plurality of signal lines 150b is disposed at the periphery of the light transmissive area CA, the resistors R9, R10, R11, R12, and R13 may be respectively connected to end portions of all the signal lines 150b. Areas where the resistors R9, R10, R11, R12, and R13 are disposed may be included in a dead space.

When the light transmissive area CA is disposed close to the right edge of the display area DA, a length of the signal line 150a disposed on the left side of the light transmissive area CA is longer than a length of the signal line 150b disposed on the right side of the light transmissive area CA. Thus, a distance from the driver 400a to the end portion of the signal line 150a is longer than a distance from the driver 400b to the signal line 150b. Accordingly, an RC signal delay at the end portion of the signal line 150a may be longer than an RC signal delay at the end portion of the signal line 150b, and luminance deviation may occur in images of the left side and the right side with reference to the light transmissive area CA.

In the exemplary embodiment of the invention, the resistors R9, R10, R11, R12, and R13 are connected to the end portion of the signal line 150b disposed on the right side of the light transmissive area CA to compensate the long RC signal delay at the left periphery of the light transmissive area CA such that the luminance deviation in the left and right images with reference to the light transmissive area CA may be reduced The resistors R9, R10, R11, R12, and R13 may have the same or similar resistance value, or at least two resistors may have different resistance values depending on positions. In an exemplary embodiment, in the exemplary embodiment shown in FIG. 10, the resistor R11 connected to the shortest signal line 150b may have the greatest resistance value, and a resistor away from the resistor R11 may have a resistance value that gradually decreases, for example. That is, a resistance value of the resistor R10 and a resistance value of the resistor R12 are lower than that of the resistor R11, and a resistance value of the resistor R9 and a resistance value of the resistor R13 may be lower than those of the resistors R10 and R12. According to this, a luminance deviation at the periphery of the light transmissive area CA may be more precisely compensated.

A detailed structure of a display device according to the invention will be described with reference to FIGS. 11 to 14, together with the above-described drawings.

Figure 11:
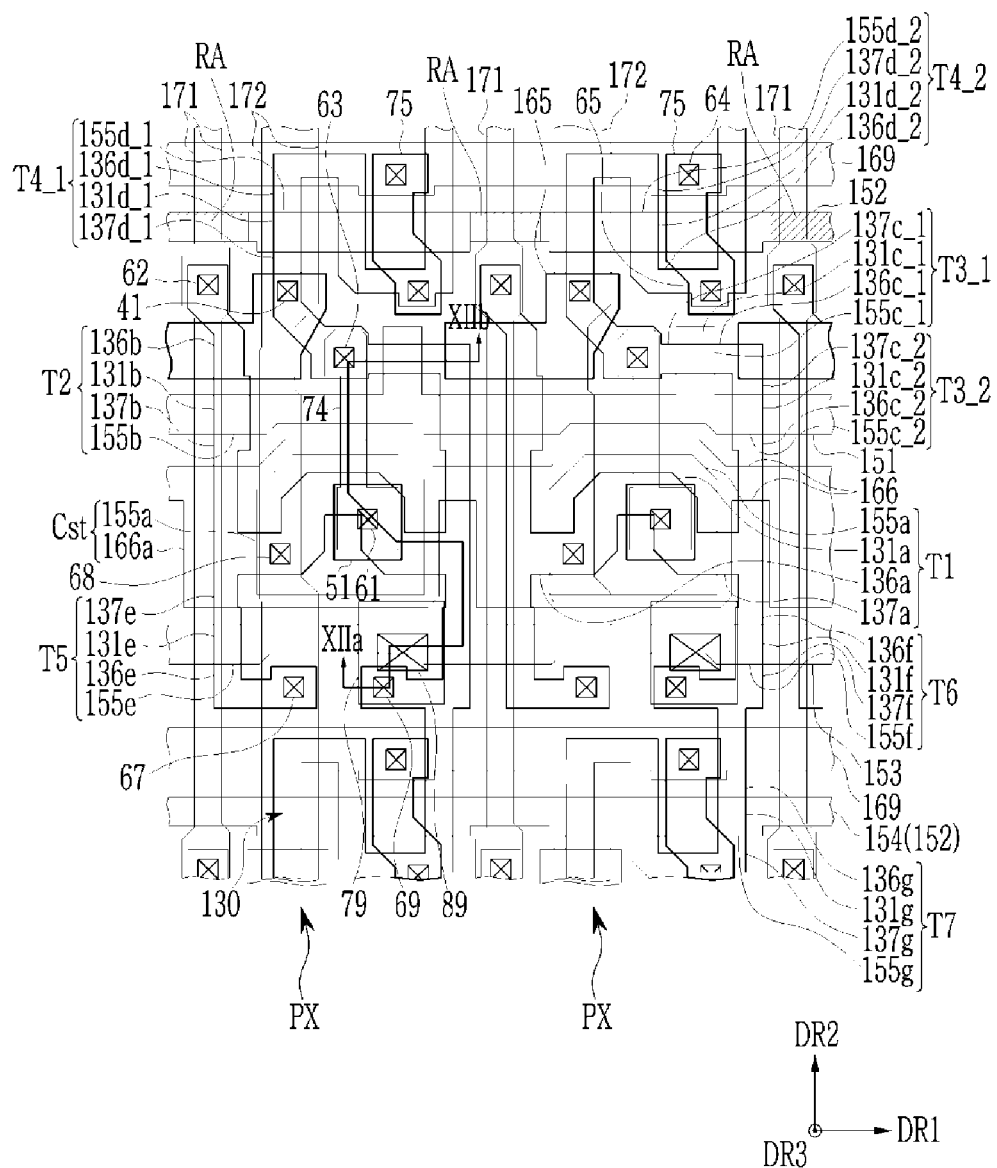
FIG. 11 is a plan view of an exemplary embodiment of two neighboring pixels disposed in a display area of a display device according to the invention.
Figure 12:
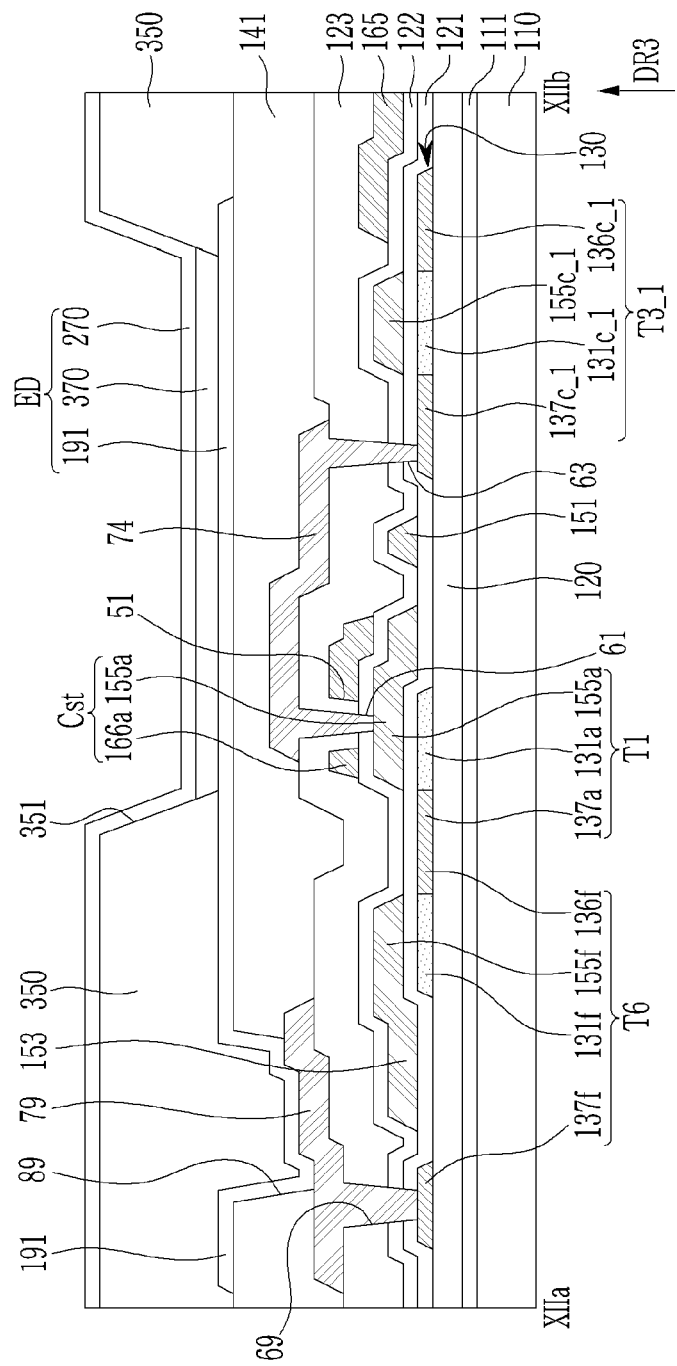
FIG. 12 is a cross-sectional view of the display device of FIG. 11, taken along line XIIa-XIIb.
Figure 13:
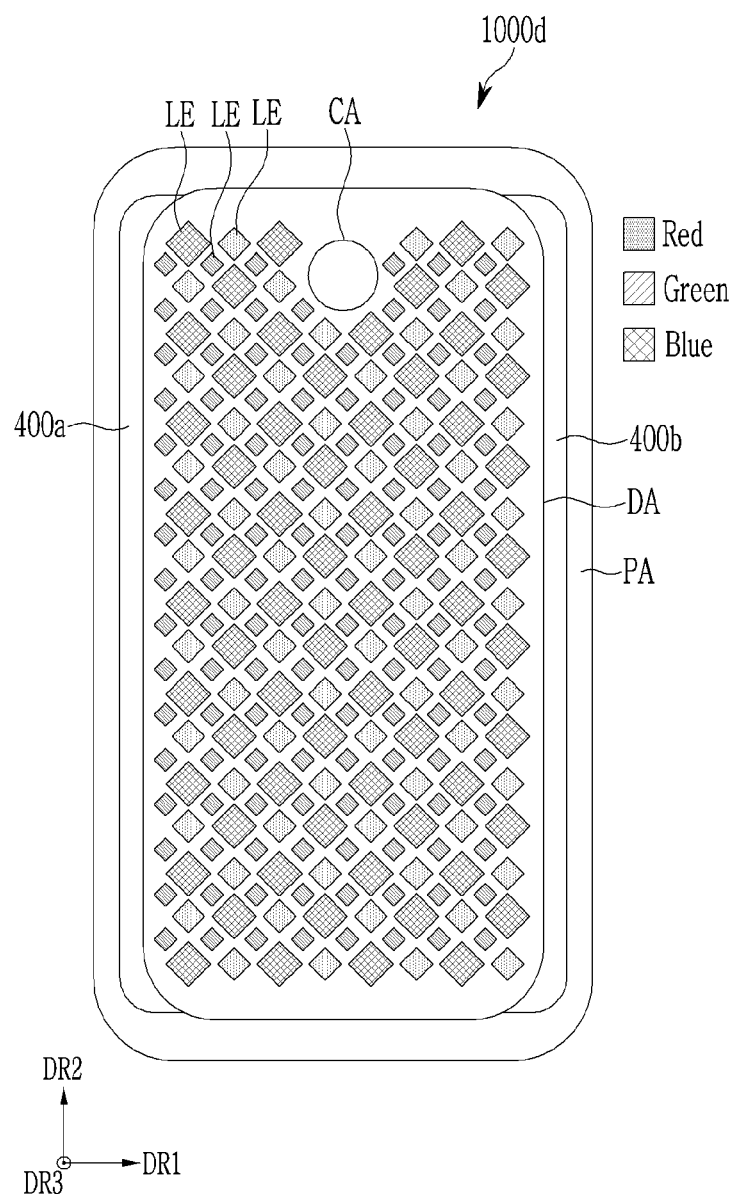
FIG. 13 is a plan view of an exemplary embodiment of the display device according to the invention.

FIG. 11 is a plan view of an exemplary embodiment of two neighboring pixels disposed in a display area of a display device according to the invention, FIG. 12 is a cross-sectional view of the display device of FIG. 11, taken along line XIIa-XIIb, and FIG. 13 is a plan view of an exemplary embodiment of the display device according to the invention.

FIG. 11 illustrates two pixels PX that neighbor each other in a first direction DR1 and have the same structure.

Referring to FIGS. 11 and 12, a barrier layer 111, which is an insulation layer, may be disposed on a substrate 110, and a buffer layer 120, which is an insulation layer, may be disposed on the barrier layer 111. In another exemplary embodiment, at least one of the barrier layer 111 and the buffer layer 120 may be omitted.

An active layer 130 is disposed on the buffer layer 120. The active layer 130 may include channel regions 131a, 131b, 131c_1, 131c_2, 131d_1, 131d_2, 131e, 131f, and 131g defining channels of a plurality of transistors T1, T2, T3_1, T3_2, T4_1, T4_2, T5, T6, and T7 included in pixel circuits of a plurality of pixels PX, and conductive regions. The conductive regions of the active layer 130 may include source regions 136a, 136b, 136c_1, 136c_2, 136d_1, 136d_2, 136e, 136f, and 136g and drain regions 137a, 137b, 137c_1, 137c_2, 137d_1, 137d_2, 137e, 137f, and 137g of the respective transistors T1, T2, T3_1, T3_2, T4_1, T4_2, T5, T6, and T7. The source regions and the drain regions are terms used to distinguish conductive regions that are disposed on both sides with reference to the respective channel regions 131a, 131b, 131c_1, 131c_2, 131d_1, 131d_2, 131e, 131f, and 131g, and the term source region and the term drain region may be switched with each other. Carrier concentration of the conductive region of the active layer 130 may be higher than carrier concentration of each of the channel regions 131a, 131b, 131c_1, 131c_2, 131d_1, 131d_2, 131e, 131f, and 131g.

The active layer 130 may include amorphous silicon, polysilicon, or an oxide semiconductor.

A first insulation layer 121 is disposed on the active layer 130, and a first conductive layer that includes a plurality of scan lines 151, 152, and 154, a control line 153, and a driving gate electrode 155a may be disposed on the first insulation layer 121. Referring to FIG. 11, the plurality of scan lines 151, 152, and 154 and the control line 153 may extend substantially in a first direction DR1.

The above-described signal lines 150, 150a, and 150b may be at least one of the scan lines 151, 152, and 154 and the control line 153.

A second insulation layer 122 may be disposed on the first conductive layer and the first insulation layer 121, and a second conductive layer that includes a storage line 166 and an initialization voltage line 169 may be disposed on the second insulation layer 122. The storage line 166 may include an expansion portion 166a that overlaps the driving gate electrode 155a.

The second conductive layer may further include a shield pattern 165. The shield pattern 165 may be disposed between the scan line 151 and the scan line 152.

A third insulation layer 123 may be disposed on the second conductive layer and the second insulation layer 122.

In an exemplary embodiment, at least one of the barrier layer 111, the buffer layer 120, the first insulation layer 121, the second insulation layer 122, and the third insulation layer 123 may include an inorganic insulation material such as a silicon oxide, a silicon nitride, a silicon oxynitride, an aluminum oxide, and the like and/or an organic insulation material, for example.

A plurality of openings 41, 61, 62, 63, 64, 65, 67, 68, and 69 may be defined in some or all of the first insulation layer 121, the second insulation layer 122, and the third insulation layer 123.

A third conductive layer that includes a plurality of connection members 74, 75, and 79, data lines 171, and driving voltage lines 172 may be disposed on the third insulation layer 123. The plurality of connection members 74, 75, and 79 is connected with the source regions 136a, 136b, 136c_1, 136c_2, 136d_1, 136d_2, 136e, 136f, and 136g or the drain regions 137a, 137b, 137c_1, 137c_2, 137d_1, 137d_2, 137e, 137f, and 137g of the active layer 130.

The data line 171 and the driving voltage line 172 extend substantially in the second direction DR2 and thus may cross the plurality of scan lines 151, 152, and 154. The extension portion 166a of the storage line 166 is connected with the driving voltage line 172 through the opening 68 and thus may receive a driving voltage.

The driving voltage line 172 is electrically connected with the shield pattern 165 though the opening 41 and may transmit a driving voltage to the shield pattern 165. In another exemplary embodiment, the shield pattern 165 may be omitted.

The first transistor T1 includes a channel region 131a, a source region 136a, a drain region 137a, and a driving gate electrode 155a. The driving gate electrode 155a may be connected with the connection member 74 through the opening 61. The opening 61 may be defined in an opening 51 included in the expansion portion 166a.

The second transistor T2 includes the channel region 131b, the source region 136b, the drain region 137b, and a gate electrode 155b, which is a part of the scan line 151. The source region 136b is connected with the data line 171 through the opening 62, and the drain region 137b is connected with the source region 136a of the first transistor T1.

The third transistor T3_1 and T3_2 may include an upper third transistor T3_1 and a lower third transistor T3_2 that are connected with each other. The upper third transistor T3_1 includes the channel region 131c_1, the source region 136c_1, the drain region 137c_1, and a gate electrode 155c_1, which is a part of the scan line 151. The drain region 137c_1 is connected with the connection member 74 through the opening 63. The lower third transistor T3_2 includes the channel region 131c_2, the source region 136c_2, the drain region 137c_2, and a gate electrode 155c_2, which is a part of the scan line 151.

The fourth transistors T4_1 and T4_2 may include a left fourth transistor T4_1 and a right transistor T4_2 that are connected with each other. The left fourth transistor T4_1 includes the channel region 131d_1, the source region 136d_1, the drain region 137d_1, and a gate electrode 155d_1, which is a part of the scan line 152. The drain region 137d_1 is connected with the drain region 137c_1 of the upper third transistor T3_1, and is connected with the connection member 74 through the opening 63. The right fourth transistor T4_2 includes the channel region 131d_2, the source region 136d_2, the drain region 137d_2, and a gate electrode 155d_2, which is a part of the scan line 152. The drain region 137d_2 is connected with the source region 136d_1 of the left fourth transistor T4_1, and the source region 136d_2 is connected with the connection member 75 through the opening 65. The connection member 75 may be electrically connected with the initialization voltage line 169 through the opening 64.

The fifth transistor T5 includes the channel region 131e, the source region 136e, the drain region 137e, and a gate electrode 155e, which is a part of the control line 153. The source region 136e is electrically connected with the driving voltage line 172 through the opening 67, and the drain region 137e is connected with the source region 136a of the first transistor T1.

The sixth transistor T6 includes the channel region 131f, the source region 136f, the drain region 137f, and a gate electrode 155f, which is a part of the control line 153. The source region 136f is connected with the drain region 137a of the first transistor T1, and the drain region 137f is connected with the connection member 79 through the opening 69.

The seventh transistor T7 includes the channel region 131g, the source region 136g, the drain region 137g, and a gate electrode 155g, which is a part of the scan line 154. The source region 136g is connected with the drain region 137f of the sixth transistor T6, and the drain region 137g is connected with the connection member 75 through the opening 65 and thus may receive an initialization voltage.

A capacitor Cst included in a single pixel PX may include the driving gate electrode 155a and the expansion portion 166a of the storage line 166 that overlap each other, while disposing the second insulation layer 122 therebetween, as two terminals.

The plurality of transistors T1, T2, T3_1, T3_2, T4_1, T4_2, T5, T6, and T7 and the capacitor Cst included in each pixel PX may form a pixel circuit.

In an exemplary embodiment, at least one of the first conductive layer, the second conductive layer, and the third conductive layer may include a metal of copper (Cu), aluminum (Al), magnesium (Mg), silver (Ag), gold (Au), platinum (Pt), palladium (Pd), nickel (Ni), neodymium (Nd), iridium (Ir), molybdenum (Mo), tungsten (W), titanium (Ti), chromium (Cr), tantalum (Ta), and an alloy thereof, for example.

A fourth insulation layer 141 may be disposed on the third conductive layer. In an exemplary embodiment, the fourth insulation layer 141 may include an inorganic insulation material and/or an organic insulation material such a polyimide, an acryl-based polymer, a siloxane-based polymer, and the like.

As a fourth conductive layer, a pixel electrode layer may be disposed on the fourth insulation layer 141. The pixel electrode layer may include a pixel electrode 191 disposed in each pixel PX. The pixel electrode 191 may be connected with the connection member 79 through an opening 89 of the fourth insulation layer 141 and thus receive a data voltage.

A fifth insulation layer 350 (also referred to as a pixel defining layer) may be disposed on the fourth insulation layer 141. An opening 351 that is disposed on the pixel electrode 191 may be defined in the fifth insulation layer 350. In an exemplary embodiment, the fifth insulation layer 350 may include an organic insulation material such as a polyacryl-based resin, a polyimide-based resin, and the like.

An emission layer 370 is disposed on the pixel electrode 191. The emission layer 370 may include a portion that is disposed on the opening 351 of the fifth insulation layer 350. The emission layer 370 may include an organic light emitting material or an inorganic light emitting material.

A common electrode 270 may be disposed on the emission layer 370. The common electrode 270 is also disposed on the fifth insulation layer 350 and thus may be continuously provided throughout the plurality of pixels PX. The common electrode 270 may include a transparent conductive material.

The pixel electrode 191, the emission layer 370, and the common electrode 270 of each pixel PX form a light emitting diode ED, and one of the pixel electrode 191 and the common electrode 270 becomes a cathode while the other becomes an anode. The light emitting diode ED may form a light emitting portion connected to the pixel circuit of each pixel PX.

Referring to FIG. 13, a display panel 1000d included in a display device in an exemplary embodiment of the invention may be the same as the display panels 1000, 1000a, 1000b, and 1000c according to the above-described exemplary embodiments, and light emitting portions LE of a plurality of pixels PX may be arranged with a regular format in a display area DA. In an exemplary embodiment, each light emitting portion LE may display one color of red, green, and blue, for example. Such a light emitting portion LE is not provided in a light transmissive area CA and a dead space around the light transmissive area CA.

Figure 14:
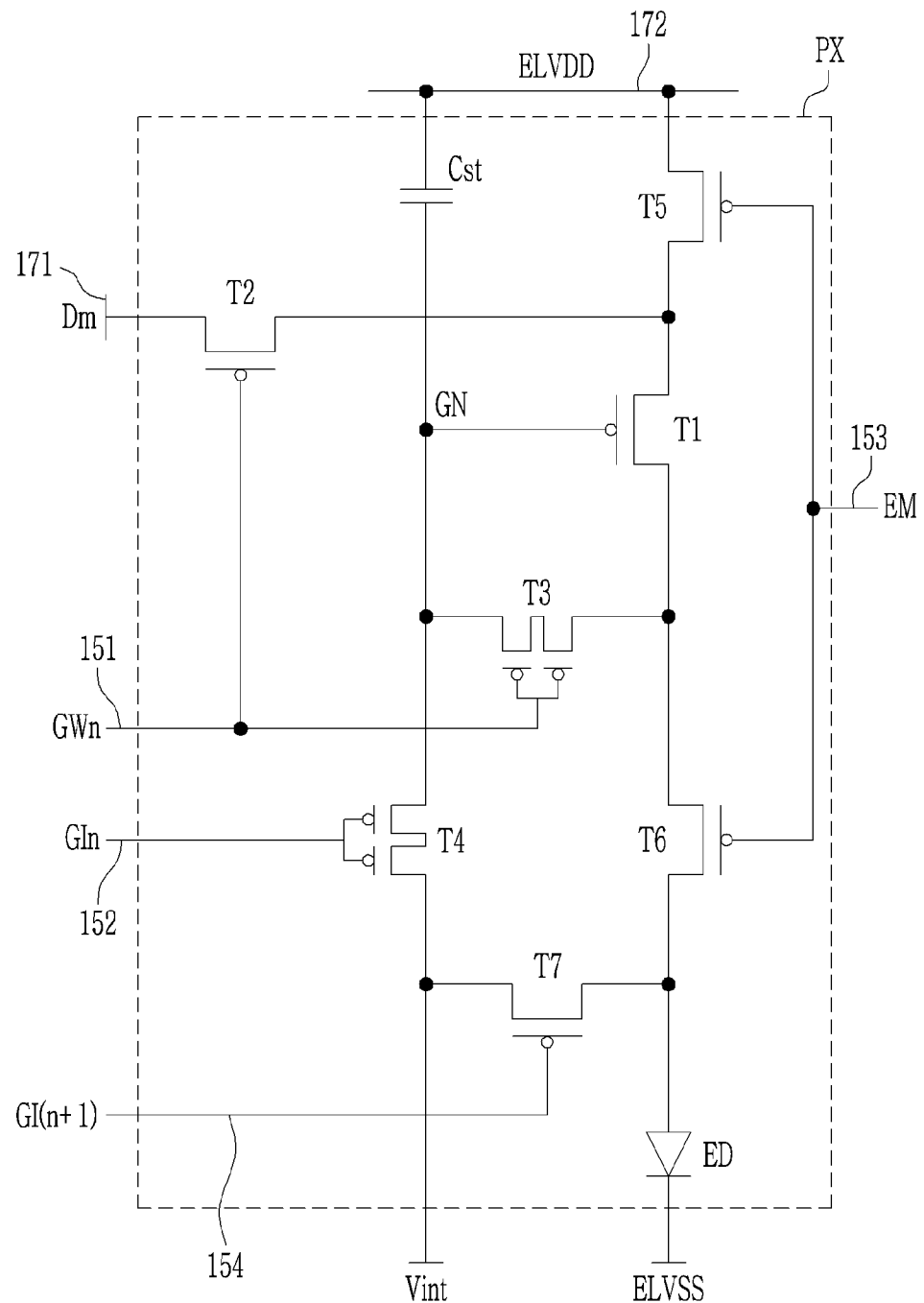
FIG. 14 is a circuit diagram of an exemplary embodiment of a pixel PX of the display device according to the invention.

FIG. 14 is an equivalent circuit diagram of each pixel PX of the display device in the exemplary embodiment illustrated in FIGS. 11 and 12.

Each pixel PX may include a plurality of transistors T1, T2, T3, T4, T5, T6, and T7 connected to a plurality of signal lines 151, 152, 153, 154, 171, and 172, a capacitor Cst, and at least one light emitting diode ED.

The plurality of scan lines 151, 152, and 154 may respectively transmit scan signals GWn, GIn, and GI(n+1), which are gate signals where n is a natural number. A control line 153 may transmit a control signal, which is a gate signal that may control light emission of the light emitting diode ED.

The scan line 151 may transmit the scan signal GWn to the second transistor T2 and the third transistor T3, the scan line 152 may transmit the scan signal GIn to the fourth transistor T4, the scan line 154 may transmit the scan signal GI(n+1) to the seventh transistor T7, and the control line 153 may transmit a control signal EM to the fifth transistor T5 and the sixth transistor T6.

A data line 171 may transmit a data signal Dm, and a driving voltage line 172 may transmit a driving voltage ELVDD. The data signal Dm may have a voltage level that varies according to an image signal input to the display device, and the driving voltage ELVDD may have a substantially constant level.

Source electrodes, drain electrodes, and gate electrodes of the transistors T1, T2, T3, T4, T5, T6, and T7 may correspond to the above-described source regions, drain regions, and gate electrodes.

One end of the capacitor Cst is connected with the gate electrode of the first transistor T1, and the other end is connected with the driving voltage line 172. A cathode of the light emitting diode ED is connected with a common voltage terminal that transmits a common voltage ELVSS and thus receives the common voltage ELVSS.

An initialization voltage Vint may be applied to a node GN when the fourth transistor T4 is turned on, and may be applied to an anode of the light emitting diode ED when the seventh transistor T7 is turned on.

A structure of the pixel PX of the invention is not limited to the structures shown in illustrated exemplary embodiments of FIGS. 11 to 14, and the number of transistors and the number of capacitors included in each pixel PX and a connection relationship may be variously modified.

Referring to FIG. 11, signal lines 150, 150a, and 150b of the display device in the exemplary embodiment of the invention are, for example, scan lines 152, and various resistors included in the scan line 152 may be disposed in various portions that do not overlap the active layer 130. In an exemplary embodiment, the resistors R, R1, R2 R3, R4, R5, R6, R7, R8, R9, R10, R11, R12, and R13 of the above-described exemplary embodiments may be provided in various resistor areas RA of the scan line 152, for example. A detailed structure of such resistors R, R1, R2 R3, R4, R5, R6, R7, R8, R9, R10, R11, R12, and R13 will be described later.

Together with the above-described drawings, referring to FIGS. 15 and 16, a structure of a resistor included in a signal line of a display device in an exemplary embodiment of the invention will be described.

Figure 15:
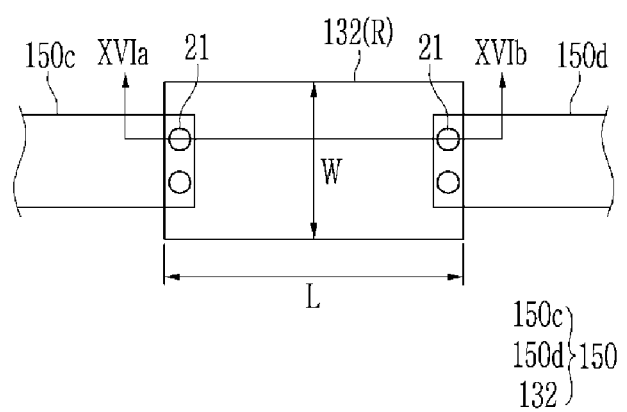
FIG. 15 is a plan view of an exemplary embodiment of a resistor connected to a signal line of a display device according to the invention.
Figure 16:
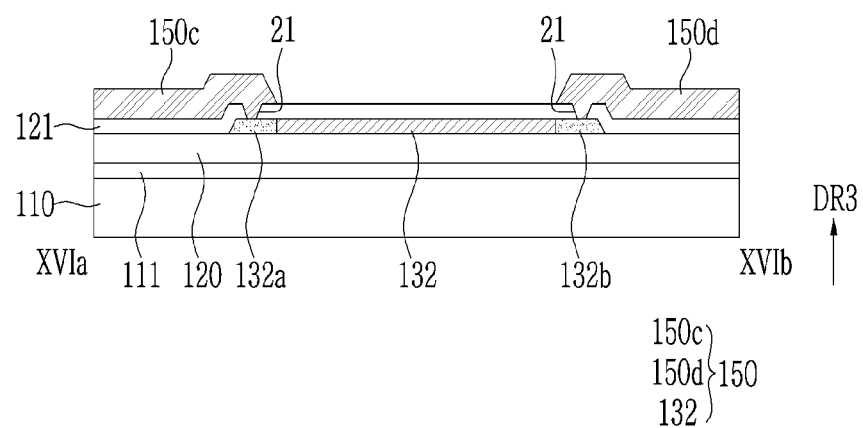
FIG. 16 is a cross-sectional view of the display device of FIG. 15, taken along line XVIa-XVIb.

FIG. 15 is a plan view of an exemplary embodiment of a resistor connected to a signal line of a display device according to the invention, and FIG. 16 is a cross-sectional view of the display device of FIG. 15, taken along line XVIa-XVIb.

Referring to FIGS. 15 and 16, a signal line 150 included in a display device in an exemplary embodiment of the invention is substantially the same as the above-described signal line 150, and may include conductive portions 150c and 150d that are connected to the above-described resistor R. Here, the resistor R represents the resistors R1, R2 R3, R4, R5, R6, R7, R8, R9, R10, R11, R12, and R13 included in the display devices according to the above-described exemplary embodiments. In addition, the signal line 150 represents the signal lines 150, 150a, and 150b connected to the resistors among the plurality of above-described signal lines.

In a plan view, two conductive portions 150c and 150d may face each other, while disposing the resistor R therebetween. The conductive portions 150c and 150d of the signal line 150 may be disposed in the same layer as the above-described first conductive layer and may include the same material as that of the first conductive layer.

The resistor R may include a material having a resistance value higher than a resistance value of the conductive portions 150c and 150d. In an exemplary embodiment, the resistor R may include an active pattern 132 that is disposed in the same layer as the above-described active layer 130 and includes the same material as that of the active layer 130, for example. The active pattern 132 may include a semiconductor material having a carrier concentration that is similar to the channel regions 131a, 131b, 131c_1, 131c_2, 131d_1, 131d_2, 131e, 131f, and 131g of the above-described active layer 130 or a carrier concentration that is similar to that of the conductive region of the active layer 130.

Referring to FIGS. 15 and 16, a first insulation layer 121 may be disposed on the active pattern 132, and the conductive portions 150c and 150d may be disposed on the first insulation layer 121. The conductive portions 150c and 150d may be electrically connected with the active pattern 132 through an opening 21 defined in the first insulation layer 121. Portions 132a and 132b of the active pattern 132, contacting the conductive portions 150c and 150d through the opening 21 may have a carrier concentration higher than that of other portions of the active pattern 132.

A length L and/or a width W of the active pattern 132 may be adjusted to variously adjust a resistance value of the resistor R to which the signal line 150 is connected.

Next, a structure of a resistor included in a signal line of a display device in an exemplary embodiment of the invention will be described with reference to FIGS. 17 to 19, together with the above-described drawings.

Figure 17:
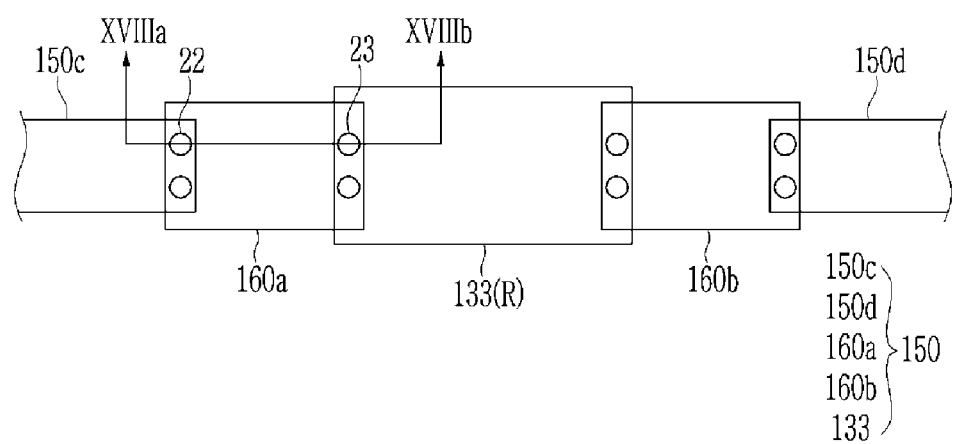
FIG. 17 is a plan view of an exemplary embodiment of a resistor connected to a signal line of a display device according to the invention.
Figure 18:
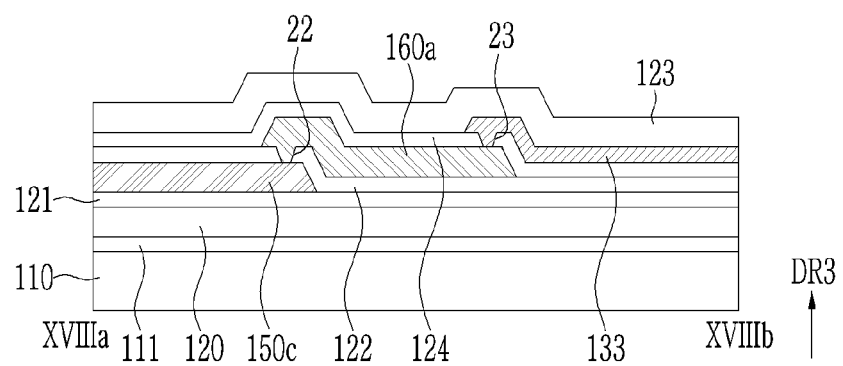
FIG. 18 is a cross-sectional view of the display device of FIG. 17, taken along line XVIIIa-XVIIIb.

FIG. 17 is a plan view of an exemplary embodiment of a resistor connected to a signal line of a display device according to the invention, and FIG. 18 is a cross-sectional view of the display device of FIG. 17, taken along line XVIIIa-XVIIIb.

Referring to FIGS. 17 and 18, a signal line 150 included in a display device in an exemplary embodiment of the invention is substantially the same as the above-described signal line, except that the signal line 150 includes conductive portions 150c and 150d, conductive portions 160a and 160b that are electrically connected to the conductive portions 150c and 150d, and resistors R connected to the conductive portions 160a and 160b. In this exemplary embodiment also, the resistor R may represent the resistors R, R1, R2 R3, R4, R5, R6, R7, R8, R9, R10, R11, R12, and R13 included in the display devices according to the above-described exemplary embodiments, and the signal line 150 may represent the signal lines 150, 150a, and 150b connected to the resistor among the above-described signal lines.

The conductive portions 150c and 150d of the signal line 150 may be disposed in the same layer as the above-described first conductive layer and may include the same material as that of the first conductive layer.

The two conductive portions 160a and 160b may face each other, while disposing the resistor R therebetween. The conductive portions 160a and 160b of the signal line 150 may be disposed in the same layer as the above-described second or third conductive layer, and may include the same material as that of the second or third conductive layer.

The resistor R may include a material having a resistance value higher than that of the conductive portions 150c, 150d, 160a, and 160b. In an exemplary embodiment, the resistor R may include an active pattern 133 that includes a semiconductor material, for example.

Referring to FIGS. 17 and 18, the conductive portions 150c and 150d are disposed on the first insulation layer 121, and a second insulation layer 122 in which an opening 22 is defined may be disposed on the conductive portions 150c and 150d. The conductive portions 160a and 160b are disposed on, for example, the above-described second insulation layer 122. The conductive portions 160a and 160b may be electrically connected with the conductive portions 150c and 150d while contacting the same through the opening 22.

An insulation layer 124 may be disposed on the conductive portions 160a and 160b. An opening 23 disposed on the conductive portion 160b may be defined in the insulation layer 124.

The active pattern 133 may be disposed on the insulation layer 124. The active pattern 133 may include amorphous silicon, polysilicon, or an oxide semiconductor. The active pattern 133 may be disposed on a layer that is different from the active layer 130, and for example, may include an oxide semiconductor material. In this case, the active layer 130 may include a polysilicon material.

The active pattern 133 may be electrically connected with the conductive portions 160a and 160b through the opening 23 of the insulation layer 124.

The third insulation layer 123 as described above may be disposed on the active pattern 133. A subsequent laminated structure may be the same as the structure in the exemplary embodiment described with reference to FIGS. 11 and 12.

In the exemplary embodiment shown in FIG. 18, the insulation layer 124 and the active pattern 133 are exemplarily disposed between the above-described second conductive layer and the third insulation layer 123, and the conductive portions 160a and 160b are exemplarily disposed in the second conductive layer.

Figure 19:
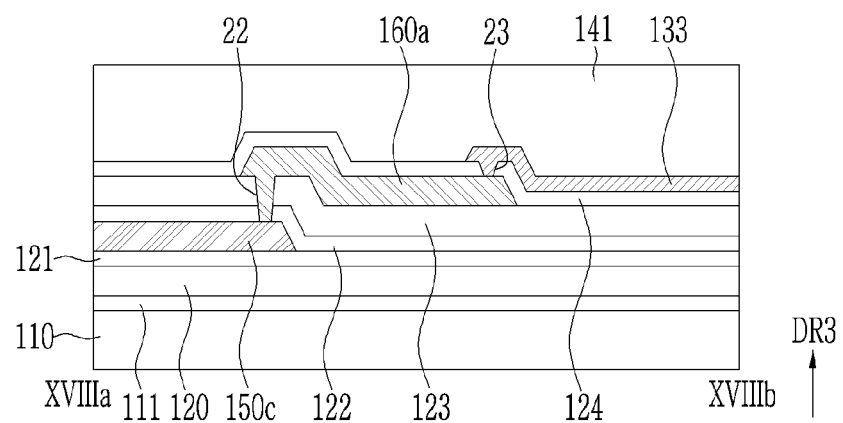
FIG. 19 is another cross-sectional view of the display device of FIG. 17, taken along line XVIIIa-XVIIIb.

FIG. 19 is another cross-sectional view of the display device of FIG. 17, taken along line XVIIIa-XVIIIb.

Referring to FIG. 19, a display device according to the illustrated exemplary embodiment is substantially the same as the display device of the above-described exemplary embodiment of FIGS. 17 and 18, but conductive portions 160a and 160b may be disposed in the same layer as a third conductive layer that is disposed on a third insulation layer 123 and may include the same material as that of the third conductive layer. An insulation layer 124 and an active pattern 133 are disposed on the conductive portions 160a and 160b, and the active pattern 133 may be electrically connected with the conductive portions 160a and 160b through an opening 23 of the insulation layer 124. A fourth insulation layer 141 may be disposed on the active pattern 133, and a subsequent lamination structure thereon may be the same as the structure according to the above-described exemplary embodiment of FIGS. 11 and 12.

Next, a structure of resistors included in signal lines 150, 150a, and 150b of a display device in an exemplary embodiment of the invention will be described with reference to FIG. 20, together with the above-described drawings.

Figure 20:
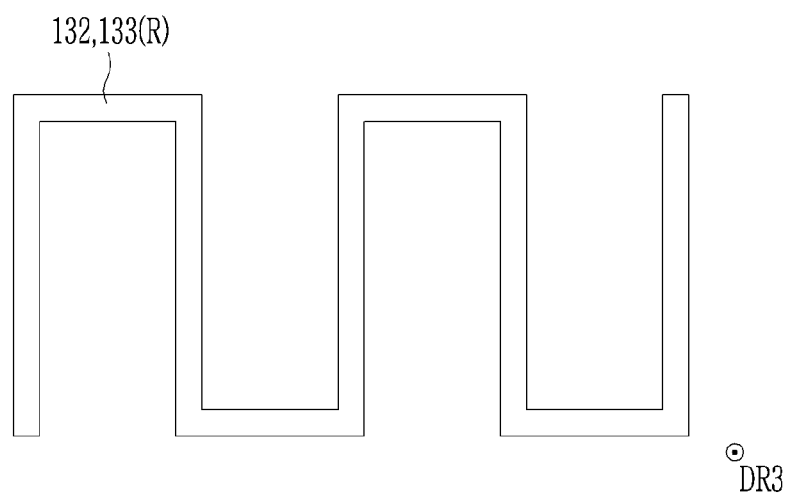
FIG. 20 shows a planar shape of an exemplary embodiment of resistors connected to signal lines of a display device according to the invention.

FIG. 20 shows a planar shape of resistors connected to signal lines of a display device in an exemplary embodiment of the invention.

Referring to FIG. 20, active patterns 132 and 133 included in the above-described plurality of resistors R may be sinuated or zigzagged in a plan view. As described, a resistance value of the resistor R may be variously adjusted by adjusting the degree of bending and the number of bends of the active pattern 132.

While this invention has been described in connection with what is presently considered to be practical exemplary embodiments, it is to be understood that the invention is not limited to the disclosed embodiments. On the contrary, it is intended to cover various modifications and equivalent arrangements included within the spirit and scope of the appended claims.

What is claimed is:

1. A display device comprising:
    a substrate which includes a display area including a plurality of pixels, and a light transmissive area including a portion disposed in the display area; and
    a plurality of signal lines which are disposed in the display area and electrically connected with the plurality of pixels, the plurality of signal lines comprising:
    a first signal line which is disposed on a first side with reference to the light transmissive area;
    a second signal line which is disposed on a second side with reference to the light transmissive area; and
    a third signal line which is disposed on a third side with reference to the light transmissive area,
    wherein the first signal line, the second signal line, and the third signal extend according to a first direction,
    the first signal line is adjacent to the second signal line in the first direction,
    the third signal line is adjacent to the first signal line in a second direction which is different from the first direction,
    the first signal line and the second signal line are insulated from each other in the display area,
    a length of the third signal line in the first direction is longer than a length of the first signal line in the first direction, and
    the length of the third signal line in the first direction is longer than a length of the second signal line in the first direction.

2. The display device of claim 1, wherein the display area comprises a first edge and a second edge,
    the third signal line extends to the second edge of the display area from the first edge of the display area,
    the first signal line extends from the first edge and ends at an inside of the display area, and
    the second signal line extends from the second edge and ends at an inside of the display area, and
    the first signal line and the second signal line are disposed on a virtual line extending according to the first direction.

3. The display device of claim 2, further comprising:
    a first driver which is disposed at an outer side of the first edge of the display area; and
    a second driver which is disposed at an outer side of the second edge of the display area,
    wherein the first signal line is electrically connected with the first driver,
    the second signal line is electrically connected with the second driver, and
    the third signal line is electrically connected with the first driver and the second driver.

4. The display device of claim 3, wherein each of the first signal line and the second signal line comprises an end portion which is adjacent to the light transmissive area, and the end portion neighbors the light transmissive area in the first direction.

5. The display device of claim 4, wherein an opening which overlaps the light transmissive area is defined in the substrate.

6. The display device of claim 2, further comprising a resistor,
    wherein the display area further includes a disconnection corresponding area which overlaps the light transmissive area in the second direction, and
    the third signal line is connected to the resistor disposed in the disconnection corresponding area.

7. The display device of claim 6, wherein a length of the first signal line is longer than a length of the second signal line, the resistor is provided in plural and the third signal line is connected to a plurality of resistors disposed in the disconnection corresponding area, and among the plurality of resistors, a resistance value of a resistor disposed closest to the first edge is greater than a resistance value of a resistor disposed closest to the second edge.

8. The display device of claim 6, wherein the third signal line comprises a conductive portion disposed on the substrate, and the resistor comprises an active pattern which is electrically connected with the conductive portion and comprises a semiconductor material.

9. The display device of claim 8, wherein the active pattern is curved.

10. The display device of claim 2, further comprising a resistor connected to an end portion of the second signal line, the end portion being adjacent to the light transmissive area.

11. The display device of claim 10, wherein a length of the first signal line is longer than a length of the second signal line.

12. The display device of claim 11, wherein the second signal line is provided in plural, and the resistor is provided in plural and at least two resistors among a plurality of resistors connected to end portions of the plurality of second signal lines have different resistance values from each other.

13. A display device comprising:
a substrate which includes a display area including a plurality of pixels, a light transmissive area including a portion disposed in the display area, and a disconnection corresponding area;
a plurality of signal lines which are disposed in the display area and electrically connected with the plurality of pixels, the plurality of signal lines comprising:
a first signal line which is disposed on a first side with reference to the light transmissive area;
a second signal line which is disposed on a second side with reference to the light transmissive area and arranged with the first signal line in a first direction; and
a third signal line which is disposed on a third side with reference to the light transmissive area; and
a resistor,
wherein the third signal line is arranged with the first signal line and the second signal line in a second direction which is different from the first direction,
the disconnection corresponding area overlaps the light transmissive area in the second direction, and
the third signal line is connected to the resistor disposed in the disconnection corresponding area.

14. The display device of claim 13, wherein the resistor is provided in plural and the third signal line is connected to a plurality of resistors disposed in the disconnection corresponding area, and at least two of the plurality of resistors have different resistance values from each other.

15. The display device of claim 14, wherein a length of the first signal line is longer than a length of the second signal line, the display area comprises a first edge disposed on the first side and a second edge disposed on the second side, and among the plurality of resistors, a resistor disposed closest to the first edge has a resistance value greater than a resistance value of a resistor disposed closest to the second edge.

16. The display device of claim 13, wherein the third signal line comprises a conductive portion disposed on the substrate, and the resistor comprises an active pattern which is electrically connected with the conductive portion and comprises a semiconductor material.

17. The display device of claim 13, further comprising a resistor connected to an end portion of the second signal line, the end portion being adjacent to the light transmissive area.

18. The display device of claim 17, wherein a length of the first signal line is longer than a length of the second signal line.

19. A display device comprising:
a substrate which includes a display area including a plurality of pixels, and a light transmissive area including a portion disposed in the display area; and
a plurality of signal lines which are disposed in the display area and electrically connected with the plurality of pixels, the plurality of signal lines comprising:
a first signal line which is disposed on a first side with reference to the light transmissive area;
a second signal line which is disposed on a second side with reference to the light transmissive area and arranged with the first signal line in a first direction; and
a third signal line which is disposed on a third side with reference to the light transmissive area; and
a resistor connected to an end portion of the second signal line, the end portion being adjacent to the light transmissive area.

20. The display device of claim 19, wherein a length of the first signal line is longer than a length of the second signal line.

* * * * *